(12) United States Patent
Xia et al.

(10) Patent No.: US 11,098,416 B2
(45) Date of Patent: Aug. 24, 2021

(54) DOPED GALLIUM OXIDE CRYSTALLINE MATERIAL AND PREPARATION METHOD AND APPLICATION THEREOF

(71) Applicant: Shanghai Institute of Optics And Fine Mechanics, Chinese Academy of Sciences, Shanghai (CN)

(72) Inventors: Changtai Xia, Shanghai (CN); Qinglin Sai, Shanghai (CN); Wei Zhou, Shanghai (CN); Hongji QI, Shanghai (CN)

(73) Assignee: Shanghai Institute of Optics And Fine Mechanics, Chinese Academy of Sciences, Shanghai (CN)

( * ) Notice: Subject to any disclaimer, the term of this patent is extended or adjusted under 35 U.S.C. 154(b) by 131 days.

(21) Appl. No.: 16/508,211

(22) Filed: Jul. 10, 2019

(65) Prior Publication Data
US 2019/0352798 A1  Nov. 21, 2019

Related U.S. Application Data

(63) Continuation-in-part of application No. PCT/CN2018/074058, filed on Jan. 24, 2018.

(30) Foreign Application Priority Data

Jan. 25, 2017 (CN) .................. 201710061035.X
Mar. 3, 2017 (CN) .................. 201710124917.6

(51) Int. Cl.
*C30B 29/16* (2006.01)
*C01G 15/00* (2006.01)
(Continued)

(52) U.S. Cl.
CPC .............. *C30B 29/16* (2013.01); *C01G 15/00* (2013.01); *C30B 13/00* (2013.01); *C30B 33/02* (2013.01);
(Continued)

(58) Field of Classification Search
CPC .. C01G 15/00; C01P 2002/54; C01P 2002/76; C01P 2006/40; C01P 2006/80;
(Continued)

(56) References Cited

U.S. PATENT DOCUMENTS

2003/0107098 A1* 6/2003 Ota ..................... H01L 31/1884
257/436
2004/0136891 A1 7/2004 Kijima et al.
(Continued)

FOREIGN PATENT DOCUMENTS

CN 102431977 A 5/2012
CN 103878010 A 6/2014
(Continued)

OTHER PUBLICATIONS

E. G. Villora et al., "Electrical conductivity and carrier concentration control in β-Ga₂O₃ by Si doping," Applied Physics Letters, 92, 202120 (2008).
(Continued)

*Primary Examiner* — Mark Kopec
*Assistant Examiner* — Jaison P Thomas
(74) *Attorney, Agent, or Firm* — Mei & Mark LLP; Manni Li

(57) ABSTRACT

A Group VB element doped with a β-gallium oxide crystalline material, and a preparation method and application thereof. The series doped with the β—Ga₂O₃ crystalline material is monoclinic, the space group is C2/m, the resistivity is in the range of $2.0\times10^{-4}$ to $1\times10^4 \Omega\cdot cm$, and/or the carrier concentration is in the range of $5\times10^{12}$ to $7\times10^{20}$/cm³. The preparation method comprises steps of: mixing M₂O₅ and Ga₂O₃ with a purity of 4N or more at molar ratio of (0.000000001-0.01):(0.999999999-0.99); an then performing crystal growth. The present invention can prepare a high-conductivity β-Ga₂O₃ crystalline material with n-type
(Continued)

conductivity characteristics by conventional processes, providing a basis for applications thereof to electrically powered electronic devices, optoelectronic devices, photocatalysts or conductive substrates.

19 Claims, 3 Drawing Sheets

(51) Int. Cl.
*C30B 13/00* (2006.01)
*C30B 33/02* (2006.01)
*H01L 31/032* (2006.01)
*H01L 33/26* (2010.01)
*H01B 1/08* (2006.01)

(52) U.S. Cl.
CPC ........... *H01B 1/08* (2013.01); *H01L 31/0321* (2013.01); *H01L 33/26* (2013.01); *C01P 2002/54* (2013.01); *C01P 2002/76* (2013.01); *C01P 2006/40* (2013.01); *C01P 2006/80* (2013.01)

(58) Field of Classification Search
CPC ... H01L 31/032; H01L 31/0321; H01L 33/26; C30B 13/00; C30B 13/34; C30B 29/16; C30B 33/02

See application file for complete search history.

(56) References Cited

U.S. PATENT DOCUMENTS

2006/0150891 A1* 7/2006 Ichinose ........... H01L 21/02631
117/2
2007/0166967 A1* 7/2007 Ichinose ................. C30B 29/16
438/510
2018/0073164 A1* 3/2018 Goto ..................... H01L 21/205

FOREIGN PATENT DOCUMENTS

| JP | 2004262684 A | 9/2004 | | |
|----|---|---|---|---|
| JP | 2015083536 A | 4/2015 | | |
| WO | WO-2016152335 A1 * | 9/2016 | ............. | C30B 29/16 |

OTHER PUBLICATIONS

Shigeo Ohira et al., "Characterization of transparent and conducting Sn-doped β-$Ga_2O_3$ single crystal after annealing," Thin Solid Films, 516 (17), pp. 5763-5767 (2008).

* cited by examiner

DOPED GALLIUM OXIDE CRYSTALLINE MATERIAL AND PREPARATION METHOD AND APPLICATION THEREOF

CROSS-REFERENCE TO RELATED APPLICATIONS

The subject application is a continuation-in-part of PCT/CN2018/074058 filed on Jan. 24, 2018, which in turn claims priority on Chinese Application Nos. CN201710061035.X filed on Jan. 25, 2017 and CN201710124917.6 filed on Mar. 3, 2017 in China. The contents and subject matter of the PCT international application and the Chinese priority application are incorporated herein by reference.

TECHNICAL FIELD

The present invention relates to crystalline material of $\beta$-Ga$_2$O$_3$ doped with group VB elements and preparation method and application thereof.

BACKGROUND ART $\beta$-Ga$_2$O$_3$ is a direct wide bandgap semiconductor material with a bandgap of approximately 4.8-4.9 eV. The material has many advantages including wide band gap, fast drift velocity of saturated electrons, high thermal conductivity, high breakdown stress, and stable chemical properties, and the region from the deep ultraviolet (DUV) to the infrared (IR) is transparent. Compared with traditional transparent conductive materials, the material based on $\beta$-Ga$_2$O$_3$ may be used to prepare a new generation of semiconductor optoelectronic devices with shorter wavelength.

Pure $\beta$-Ga$_2$O$_3$ crystals exhibit semi-insulating or weakly n-type conduction. Currently, known major method to improve the n-type conductivity of the $\beta$-Ga$_2$O$_3$ crystals is to carry out 4+ ion doping, which mainly includes Si, Hf, Ge, Sn, Zr and Ti plasma doping of the fourth main group and the fourth subgroup. Taking Si as an example, the main mechanism of improving carrier concentration is as follows:

The equation shows that the theoretical limitation of Group IV Element doping to provide free electrons is 1:1. With the increase in doping concentration, the difficulty of crystalline crystallization increases, and the improvement of conductivity is limited.

Among Group IV elements, Si and Sn are the two commonly used for doping. The use of Si doped crystals is disclosed in U.S. Patent Document US20070166967A1 and Japanese Patent Document JP2015083536A. Although the above two documents report resistivity in the 2.0×10$^{-3}$ to 8.0×10$^2$Ω·cm range, the lowest resistance rate is only theoretical. Since the radius of Si$^{4+}$ and Ga$^{3+}$ is very different, with the increase of Si doping concentration, a second phase will precipitate out, leading to the decrease of crystalline quality. US20070166967A1 and JP2015083536A also only disclose Si doping concentration at about 0.2 mol % in the doped single $\beta$-Ga$_2$O$_3$ crystal. Referring to *Applied Physics Letters*, 2008, 92, 202120.

Sn doped single crystals $\beta$-Ga$_2$O$_3$ have been reported in the journal (*Thin Solid Films*, 2008, 516 (17), 5763-5767). However, due to the high volatility of tin oxides, the Sn content in the obtained crystals is only at the order of PPM even if 2-10 mol % Sn is added to the raw material ratio. It not only brings great difficulty to control its content and uniformity, but also causes equipment pollution by the volatilization of tin oxide.

Therefore, how to prepare high conductivity doping $\beta$-Ga$_2$O$_3$ crystalline in a simple way has become an important research topic in this field.

SUMMARY OF THE INVENTION

The present invention solves the problem by overcoming the limitation on the degree of improvement in the crystalline conductivity of the doped Group IV elements. In order to prepare high conductivity Group IV element doped crystals, it is difficult to crystallize and the process conditions are harsh. The present invention provides a class of Group VB element doped $\beta$-Ga$_2$O$_3$ crystalline material, preparation method and application thereof. The crystalline material doped with Group VB elements of the present invention exhibits n-type conductive characteristics, and high conductivity $\beta$-Ga$_2$O$_3$ materials may be prepared by conventional process.

Generally, doping ions with higher valence state than Ga$^{3+}$ in $\beta$-Ga$_2$O$_3$ crystalline can improve the conductivity to some extent. However, it is generally believed that if the doping ion valence state is too high, the charge is difficult to balance, and it is easy to produce more doping defects. Defects can trap electrons, significantly reduce the number of carriers that can move freely, fail to effectively achieve the purpose of improving the conductivity by doping high-priced ions, and seriously affect the application performance of materials. Therefore, currently technologies usually use Group IV elements with one higher valence than Ga$^{3+}$ to dope $\beta$-Ga$_2$O$_3$ crystals, and Group VB elements have not been reported to dope crystals.

However, through scientific design and experimental verification, the inventor of the present invention has found that certain amount of +5 valent Group VB (M=Nb, Ta, V, etc.) metal ion doped crystalline can provide more free electrons than the commonly used +4 valent ions, thus improving the carrier concentration and thereby facilitating the improvement of the conductivity. Moreover, the conductivity of the material can be regulated by the content control of doped element M. The main defect reaction mechanism is as follows:

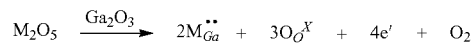

As seen from the above equation, the theoretical limiting capacity of free electron supply by doping elements of Group VB can be 1:2, and the improvement in conductivity is significantly greater than that of Group IV elements. Therefore, crystals can be obtained at high doping concentration by using conventional process.

Further, the inventor of the present invention has found that after annealing the $\beta$-Ga$_2$O$_3$ crystalline doped with Group VB elements, the oxygen vacancy in the crystalline can be removed, and the control range of carrier concentration can be increased, providing a basis for expanding its application range.

The present invention solves the above technical problems through the following technical solutions.

The present invention provides a Group VB element-doped $\beta$-Ga$_2$O$_3$ crystalline material, doped elements M=Nb, Ta, V, etc. The doped crystalline belongs to monoclinic crystalline system and the space group is C2/m. Resistivity of doped materials described in $2.0 \times 10^{-4}$ to $1 \times 10^4 \Omega \cdot cm$ range and/or Carrier concentrations range from $5 \times 10^{12}$ to $7 \times 10^{20}/cm^3$.

In the present invention, the term crystalline material refers to a solid material whose internal structure presents a long range order, including solid crystal and liquid crystal where solid state material is the main component, etc. Among the crystal materials, crystalline material is categorized according to the macroscopic aggregate state and particle diameter of the crystalline particles during the crystallization process to, including, single crystal, thin film, polycrystalline (powder crystal), eutectic, microcrystalline, and nano crystalline, etc. In the present invention, there is no special limitation on the macroscopic existing form of the crystalline material, such as powder, particle, film, etc.

In the present invention, the molecular formula of the Group VB element doped crystalline material is $Ga_{2(1-x)}M_{2x}O_3 0.0.000000001 \le x \le 0.01$, preferably, the range is $0.000001 \le x \le 0.01$.

In the present invention, the M doped $\beta$-$Ga_2O_3$ crystalline material is preferably M doped $\beta$-$Ga_2O_3$ crystal, and more preferably, M doped $\beta$-$Ga_2O_3$ single crystal.

In the present invention, the resistivity range of M doped crystalline material is preferably from $2.0 \times 10^{-3}$ to $3.6 \times 10^2 \Omega \cdot cm$. If M is Ta, the preferred range is from $4 \times 10^{-3}$ to $7.9 \ \Omega \cdot cm$. If M is Nb, the preferred range is from $5.5 \times 10^{-3}$ to $36 \ \Omega \cdot cm$. If M is V, the preferred range is from $3 \times 10^{-2}$ to $50 \ \Omega \cdot cm$.

In the present invention, the preferred carrier concentration range of M doped crystalline material is from $3.7 \times 10^{15}$ to $6.3 \times 10^{19}/cm^3$. If M is Ta, the preferred range is from $3.7 \times 10^{15}$ to $3.0 \times 10^{19}/cm^3$. If M is Nb, the preferred range is from $9.55 \times 10^{16}$ to $1.8 \times 10^{19}/cm^3$. If M is V, the preferred range is from $5 \times 10^{15}$ to $3.69 \times 10^{18}/cm^3$.

Doping scheme provided by the present invention may be obtained by the conventional crystal growth method. According to the conventional method in the field, $M_2O_5$ and $Ga_2O_3$ with purity above 4N may be mixed according to a molar ratio (0.000000001-0.01):(0.9999999-0.99) for crystal growth.

In the present invention, the term purity refers to the mass fraction of $M_2O_5$ or $Ga_2O_3$ in the sample. When the raw material purity of $M_2O_5$ or $Ga_2O_3$ is lower than the required purity, the conductivity of the final crystalline material is affected due to excessive impurities.

In the present invention, the purity of $M_2O_5$ and $Ga_2O_3$ is better than 5N, that is, the mass content of $M_2O_5$ or $Ga_2O_3$ in the sample is 99.999%. When the M doped crystalline material is M doped single crystal, the purity of $Ga_2O_3$ used in the preparation process is better than 6N, that is, the mass content of $Ga_2O_3$ in the sample is 99.9999%.

In the present invention, the M doped $\beta$-$Ga_2O_3$ crystalline material can be further annealed to remove defects such as oxygen vacancy in the crystal and increase the control range of the carrier concentration. Conventional annealing temperature and time may be used, such as 1000° C. to 1200° C. and annealing time of 3-10 hrs.

In the present invention, M doped $\beta$-$Ga_2O_3$ crystalline material can contain impurity elements that are unavoidable during the refining process of the raw materials and impurity elements that are inevitably mixed in during the process. Compared with all compositions, the above impurity element content is preferably below 10 ppm.

In the present invention, the $\beta$-$Ga_2O_3$ crystal growth method and condition used for preparing doped crystalline materials are not specifically limited, which may be conventional crystal growth method and condition in the field. When the doped $\beta$-$Ga_2O_3$ crystalline material is a single crystal, the melt method commonly used in the field is used to grow the single crystal. Generally, the melt growth method is to introduce the seed crystal into the melt and control the nucleation of the single crystal, and then carry out the phase transition at the phase interface between the seed crystal and the melt to promote the continuous growth of the crystal, including the Czochralski, edge-defined film fed growth, Bridgman-Stockbarger Method, the optical floating zone method, the flame melting method and so on. The optical floating zone method and edge-defined film fed growth method are both simple and efficient methods. The examples of the present invention adopt the optical floating region method.

Among them, the steps of preparing the M-doped $\beta$-$Ga_2O_3$ single crystal by the optical floating zone method generally include mixing, rod making, sintering, and crystal growth.

In the process, the mixing may be carried out by a mixing method conventionally used in the art, such as wet mixing. The kind and amount of the solvent to be used in the wet mixing are not particularly limited as long as the $M_2O_5$ and $Ga_2O_3$ can be uniformly mixed and easily removed later, and a volatile solvent such as ethanol is generally used. After dispersing and mixing $M_2O_5$ and $Ga_2O_3$ in a volatile solvent, the solvent can be completely volatilized by baking. In order to make the mixing of $M_2O_5$ and $Ga_2O_3$ more uniform, the wet mixing may also be carried out by a wet ball milling process, which may be conventional in the art, for example 12-24 hrs.

In the process, the pressure bar can be operated in a manner conventional in the art, and the pressure bar is generally performed using an isotactic press. Those skilled in the art know that the mixture of $M_2O_5$ and $Ga_2O_3$ is powdery and can be easily pressed, and can make the pressing uniform. Therefore, if the mixture has agglomeration before pressing, it can be ground into a powder by grinding, such as by ball milling.

In an embodiment of the present invention, $M_2O_5$ having a purity of 4N and $Ga_2O_3$ having a purity of 6N are mixed at a molar ratio of (0.000001-0.01):(0.999999-0.99), and wet ball milling is conducted by adding an appropriate amount of absolute ethanol; ball milling time is 12-24 hrs, so that $M_2O_5$ and $Ga_2O_3$ are thoroughly mixed. Then, the mixture obtained is baked at 80-100° C. for 3-6 hrs to completely evaporate the ethanol, and then the dried mixture is ball-milled into powdery shape for use in a pressure bar.

In the process, the sintering can be carried out according to the conventional sintering temperature and time in the art to remove moisture in the $M_2O_5$ and $Ga_2O_3$ mixture, and to solid phase reaction of $M_2O_5$ and $Ga_2O_3$ to form a polycrystalline material. The sintering temperature is preferably from 1400 to 1600° C., and the sintering time is preferably from 10 to 20 hours. The sintering is generally carried out in a muffle furnace.

In the process, the crystal growth atmosphere is preferably a vacuum, an inert atmosphere, or an oxidizing atmosphere to ensure the valence state of the Group VB metal M ions. The inert atmosphere may be an inert atmosphere conventional in the art, such as a nitrogen atmosphere or an argon atmosphere; the oxidizing atmosphere may be an oxidizing atmosphere conventional in the art, such as an oxygen atmosphere or an air atmosphere.

Among them, the preparation of the Group VB metal M-doped $\beta$-$Ga_2O_3$ single crystal is usually carried out by a melt method. Generally, the $\beta$-$Ga_2O_3$ crystal is used as a seed crystal, and the melt is formed by melting the sintered $M_2O_5$ and $Ga_2O_3$ polycrystalline materials, and the melt is gradually cooled and crystallized along the seed crystal to form a single crystal. Specific methods include a floating zone method, edge-defined film fed growth, a temperature ladder method, a Czochralski method, a Bridgman-Stockbarger Method, and the like.

In one embodiment of the present invention, the growing Group VB metal M-doped $\beta$-$Ga_2O_3$ single crystal is carried out by a floating zone method, and the following steps are performed. The sintered $M_2O_5$ and $Ga_2O_3$ polycrystalline rods are loaded into the floating zone furnace as the upper rod, and the $Ga_2O_3$ crystal in the <010> direction is used as the seed crystal. Firstly, raise the temperature to melt the seed crystal, then contacts the loading rod, adjusts the rotation speed and rotation direction of the rod and the seed crystal, inoculates, starts crystal growth. The growth rate of the crystal is 4.5-6 mm/hr, the rotation speed is 8-12 rpm, and the growth atmosphere is an air atmosphere. After the crystal growth is completed, the melting zone is pulled, slowly lowered to room temperature, and the crystal is taken out.

In addition to the <010> direction, the seed crystal used in the present invention may also be other crystal orientation $\beta$-$Ga_2O_3$ crystals (such as <001> direction, etc.).

The present invention also provides a Group VB metal M-doped $\beta$-$Ga_2O_3$ crystalline material obtained by the above preparation method.

The present invention also provides the use of the M-doped $\beta$-$Ga_2O_3$ crystalline material on power electronic devices, optoelectronic devices, photo catalysts, or conductive substrates. The present invention employs various applicable crystal faces including $\beta$-$Ga_2O_3$ crystalline materials including (100), (−201), and (010).

In the present invention, the optoelectronic device comprises a transparent electrode, a solar panel, a light emitting device, a photodetector, a sensor, etc. The conductive substrate includes a substrate material as a GaN-based and/or AlN-based material, a substrate material of $\beta$-$Ga_2O_3$ itself, and the like.

In addition, the Group VB element doped gallium oxide crystalline material of the present invention is also applicable to other crystalline gallium nitride crystalline materials (such as germanium $\alpha$-$Ga_2O_3$, etc.) and other gallium nitride amorphous materials.

Based on the common knowledge in the art, the above various preferred conditions can be arbitrarily combined to obtain preferred embodiments of the present invention.

The reagents and starting materials used in the present invention are commercially available.

The positive progress made in the present invention are:

(1) The limit ability of the present invention for the free electrons of the germanium $\beta$-$Ga_2O_3$ doped with a 5-valent Group VB metal ion is 1:2, which is significantly higher than the ability of the +4 valence ion doping to provide free electrons (1:1). Therefore, more free electrons can be provided at the same doping concentration, which is more favorable for increasing the carrier concentration and improving the conductivity.

(2) The present invention adopts a 5-valent Group VB metal ion doped crystalline $\beta$-$Ga_2O_3$, and the conductivity of the $\beta$-$Ga_2O_3$ crystalline material can be controlled by controlling the content of the doping element M. The resistivity of Ta-doped $\beta$-$Ga_2O_3$ crystalline material can be controlled within a range of $2.0\times10^{-4}$ to $1\times10^4$ $\Omega\cdot$cmm and the carrier concentration can be controlled within a range of $5\times10^{12}$ to $7\times10^{20}$/$cm^3$; the resistivity of Nb-doped $\beta$-$Ga_2O_3$ crystalline material can be controlled within a range of $2.5\times10^{-4}$ to $1\times10^4\Omega\cdot$cm, and the carrier concentration can be controlled within a range of $5\times10^{12}$ to $5.6\times10^{20}$/$cm^3$; the resistivity of V-doped $\beta$-$Ga_2O_3$ crystalline material can be controlled within a range of $2.0\times10^{-4}$ to $1\times10^4\Omega\cdot$cm, and the carrier concentration can be controlled within a range of $5\times10^{12}$ to $7\times10^{20}$/$cm^3$.

(3) The Group VB metal-doped $\beta$-$Ga_2O_3$ crystalline material of the present invention can be prepared by a conventional method in the art without expensive raw materials and demanding processes.

(4) After annealing the Group VB metal doped crystalline, the oxygen vacancies in the crystal lattice can be removed, and the control range of the carrier concentration increases, thereby providing a basis for its application.

DETAILED DESCRIPTION OF THE INVENTION

Figure 1:
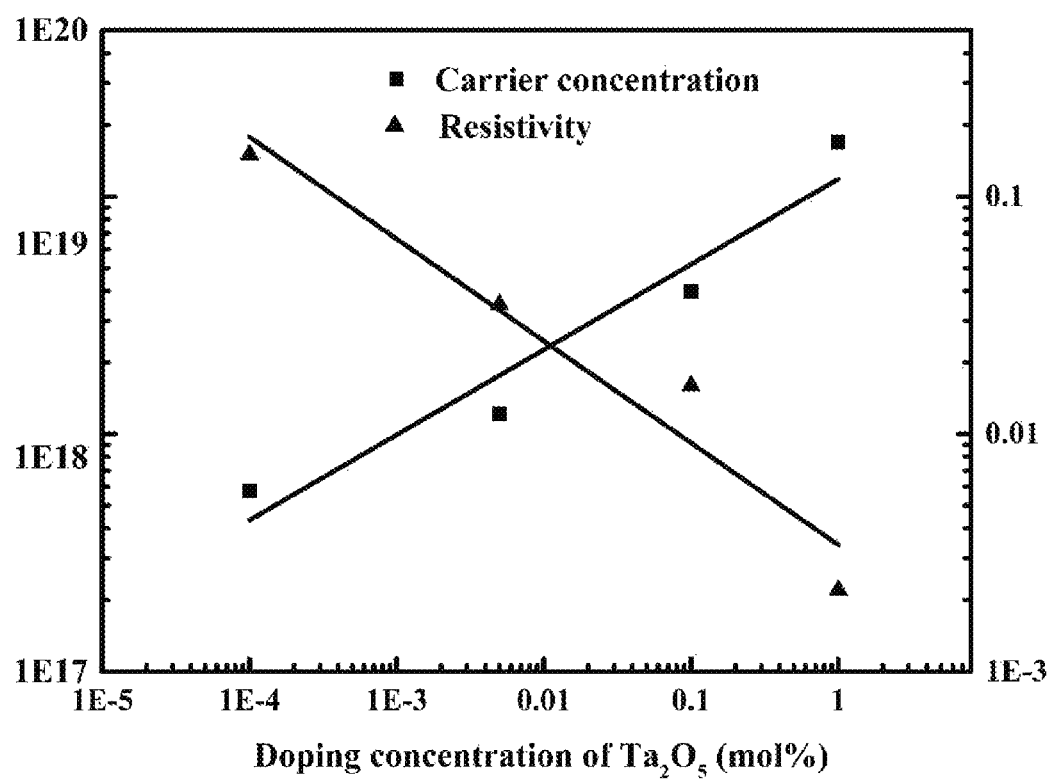
FIG. 1 is a graph showing the relationship between the doping concentration of $Ta_2O_5$ (as shown in the horizontal axis (mol %)) and the carrier concentration (as shown on the vertical axis on the left ($cm^{-3}$)) and resistivity (as shown on the vertical axis on the right ($\Omega\cdot$cm)) of the Ta-doped $\beta$-$Ga_2O_3$ primary crystal of Example 1-4 in the present invention.

The present invention is further illustrated in the following examples, without thereby limiting the present invention to the scope of the examples. The experimental methods in the following examples which do not specify the specific conditions are selected according to conventional methods and conditions, or according to the product specifications.

In the following examples, the starting materials and reagents used are commercially available.

Example 1

A Ta-doped $\beta$-$Ga_2O_3$ single crystal with a molecular formula of $Ga_{2(1-x)}Ta_{2x}O_3$ (x=0.000001) and belonging to the monoclinic system and a space group of C2/m is prepared by the method and specific steps as follows:

(1) Ingredients: $Ga_2O_3$ with a purity of 6N or more and $Ta_2O_5$ with a purity of 4N or more are weighed according to a molar ratio of 0.999999:0.000001;

(2) Mixing: put the weighed raw materials into a clean PTFE ball mill jar, put into a high-purity corundum ball, pour the appropriate amount of absolute ethanol, seal, put into a ball mill, and mix for 12 hrs;

(3) Drying: the ball grinding tank is placed in an oven, baked at 80° C. for 6 hrs, the ethanol is completely volatilized, and then placed in a ball mill for 10 minutes to grind the dried bulk material into a powder;

(4) Pressure bar: the dried mixed powder is placed in an organic mold and pressed into a material bar by using an isotactic press;

(5) Sintering: the pressed rod is placed in a muffle furnace and sintered at 1500° C. for 10 hrs, the moisture in the raw material is removed, and the $Ta_2O_5$ and the $Ga_2O_3$ raw material are subjected to solid phase reaction to form a polycrystalline material;

(6) Crystal growth: the sintered polycrystalline rod is placed in a floating zone furnace as an upper rod, and the $Ga_2O_3$ crystal in the <010> direction is placed below as a seed crystal. First, temperature is raised to melt the seed crystal, and then the seed crystal is contacted with the upper rod to reach stabilization and initiate crystal growth. The crystal growth rate is 5 mm/hr, the rotation speed is 10 rpm, and the growth atmosphere is air atmosphere. After the crystal growth is completed, stop the dropping of the loading rod, and cause the gradual separation of the melting zone by naturally dropping the crystal underneath. After about 1 hour, the temperature slowly drops to room temperature, and the crystal is taken out. The primary crystal obtained therefrom is intact with even color and no cracking;

(7) Annealing: The resulting primary crystals are annealed at 1000° C. for 3 hrs.

Example 2

A Ta-doped β-$Ga_2O_3$ single crystal with a molecular formula of $Ga_{2(1-x)}Ta_{2x}O_3$ (x=0.00005) and belonging to the monoclinic system and a space group of C2/m is prepared by the same steps and conditions as in Example 1, except that the doping concentration of $Ta_2O_5$ in step (1) is different, and the molar ratio of $Ga_2O_3$ to $Ta_2O_5$ is 0.99995:0.00005.

Example 3

A Ta-doped β-$Ga_2O_3$ single crystal with a molecular formula of $Ga_{2(1-x)}Ta_{2x}O_3$ (x=0.001), belonging to the monoclinic system and a space group of C2/m is prepared by the same steps and conditions as in Example 1, except that the doping concentration of $Ta_2O_5$ in step (1) is different, and the molar ratio of $Ga_2O_3$ to $Ta_2O_5$ is 0.999:0.001. Additionally, no annealing operation is performed.

Example 4

A Ta-doped β-$Ga_2O_3$ single crystal with a molecular formula of $Ga_{2(1-x)}Ta_{2x}O_3$ (x=0.01) and belonging to the monoclinic system and a space group of C2/m is prepared by the same steps and conditions as in Example 1, except that the doping concentration of $Ta_2O_5$ in step (1) is different, and the molar ratio of $Ga_2O_3$ to $Ta_2O_5$ is 0.99:0.01. No annealing operation is performed.

Example 5

A Nb-doped β-$Ga_2O_3$ single crystal with a molecular formula of $Ga_{2(1-x)}Nb_{2x}O_3$ (x=0.000001) and belonging to the monoclinic system and a space group of C2/m is prepared by the same steps and conditions as in Example 1, except that the dopant ($Nb_2O_5$) and doping concentration of $Nb_2O_5$ in step (1) are different.

Example 6

A Nb-doped β-$Ga_2O_3$ single crystal with a molecular formula of $Ga_{2(1-x)}Nb_{2x}O_3$ (x=0.00001) and belonging to the monoclinic system and a space group of C2/m is prepared by the same steps and conditions as in Example 1, except that the dopant ($Nb_2O_5$) and doping concentration of $Nb_2O_5$ in step (1) are different.

Example 7

A Nb-doped β-$Ga_2O_3$ single crystal with a molecular formula of $Ga_{2(1-x)}Nb_{2x}O_3$ (x=0.0001) and belonging to the monoclinic system and a space group of C2/m is prepared by the same steps and conditions as in Example 1, except that the dopant ($Nb_2O_5$) and doping concentration of $Nb_2O_5$ in step (1) are different. No annealing operation is performed.

Example 8

A Nb-doped β-$Ga_2O_3$ single crystal with a molecular formula of $Ga_{2(1-x)}Nb_{2x}O_3$ (x=0.002) and belonging to the monoclinic system and a space group of C2/m is prepared by the same steps and conditions as in Example 1, except that the dopant ($Nb_2O_5$) and doping concentration of $Nb_2O_5$ in step (1) are different. No annealing operation is performed.

Example 9

A Nb-doped β-$Ga_2O_3$ single crystal with a molecular formula of $Ga_{2(1-x)}Nb_{2x}O_3$ (x=0.008) and belonging to the monoclinic system and a space group of C2/m is prepared by the same steps and conditions as in Example 1, except that the dopant ($Nb_2O_5$) and doping concentration of $Nb_2O_5$ in step (1) are different. No annealing operation is performed.

Example 10

A V-doped β-$Ga_2O_3$ single crystal with a molecular formula of $Ga_{2(1-x)}V_{2x}O_3$ (x=0.01) and belonging to the monoclinic system and a space group of C2/m is prepared by the same steps and conditions as in Example 1, except that the dopant ($V_2O_5$) and doping concentration of $V_2O_5$ in step (1) are different. No annealing operation is performed.

Example 11

A V-doped β-$Ga_2O_3$ single crystal with a molecular formula of $Ga_{2(1-x)}V_{2x}O_3$ (x=0.00001) and belonging to the monoclinic system and a space group of C2/m is prepared by the same steps and conditions as in Example 1, except that the dopant ($V_2O_5$) and doping concentration of $V_2O_5$ in step (1) are different. No annealing operation is performed.

Comparative Example

A pure β-$Ga_2O_3$ single crystal without $Ta_2O_5$ doping is prepared by the same steps and conditions as in Example 1.

The M-doped maple-$Ga_2O_3$ single crystals obtained in Examples 1-11 and the pure $Ga_2O_3$ single crystal in the comparative example are cut into samples with the size of 5 mm×5 mm×0.3 mm. Four (4) Indium (In) electrodes are fabricated on four corners of each of the samples and Hall measurements are taken. All samples show N-type conductivity and detail results of carrier concentration and resistivity as shown in Table 1.

TABLE 1

Carrier concentration and resistivity of different examples

| Examples | Dopants | carrier concentration (/cm³) | | Resistivity (Ω·cm) | |
|---|---|---|---|---|---|
| | | as-grown | after annealing | as-grown | after annealing |
| Example1 | Ta = 0.000001 | $7.12 \times 10^{17}$ | $3.7 \times 10^{15}$ | 0.13 | 7.9 |
| Example2 | Ta = 0.00005 | $1.44 \times 10^{18}$ | $5.4 \times 10^{16}$ | 0.04 | 0.86 |
| Example3 | Ta = 0.001 | $6.3 \times 10^{18}$ | $1.7 \times 10^{17}$ | 0.02 | — |
| Example4 | Ta = 0.01 | $3.0 \times 10^{19}$ | — | 0.004 | — |
| Example5 | Nb = 0.000001 | $2.014 \times 10^{18}$ | $9.554 \times 10^{16}$ | 0.07746 | 36.63 |
| Example6 | Nb = 0.00001 | $7.484 \times 10^{18}$ | $2.613 \times 10^{17}$ | 0.01584 | 2.065 |
| Example7 | Nb = 0.0001 | $1.596 \times 10^{18}$ | — | 0.09291 | — |
| Example8 | Nb = 0.002 | $8.818 \times 10^{18}$ | — | 0.009181 | — |
| Example9 | Nb = 0.008 | $1.812 \times 10^{19}$ | — | 0.005523 | — |
| Example10 | V = 0.01 | $3.69 \times 10^{18}$ | — | 0.03 | — |
| Example11 | V = 0.000001 | $2.68 \times 10^{17}$ | — | 0.54 | — |
| Contrastive example | — | $3.96 \times 10^{14}$ | exceeding limit of detection | 67 | exceeding limit of detection ($>10^5$) |

According to the data from Table 1, the pure crystal of $Ga_2O_3$ is almost insulated after annealing. Compared with the pure crystal, the carrier concentration and conductivity of $Ga_2O_3$ single crystal doped with Group VB elements increase significantly, and the carrier concentration increase at least $10^3$ times and the resistivity decrease at least 500 times, indicating that M metal ions have been successfully doped into the lattice of $Ga_2O_3$ and achieve desired control effect.

Figure 2:
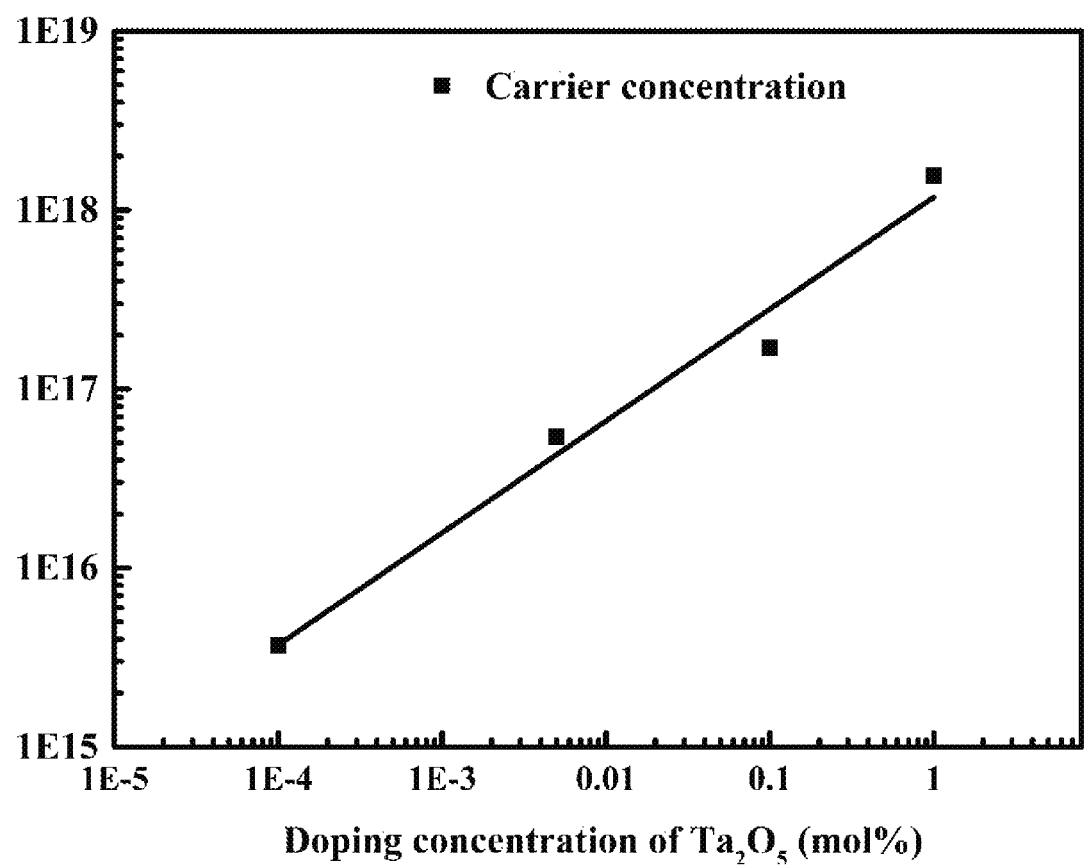
FIG. 2 is a graph showing the relationship between the doping concentration of $Ta_2O_5$ (as shown in the horizontal axis (mol %)) after annealing and the carrier concentration (as shown on the vertical axis on the left ($cm^{-3}$)) and resistivity of the Ta-doped $\beta$-$Ga_2O_3$ after annealing primary crystal of Example 1-3 in the present invention.
Figure 3:
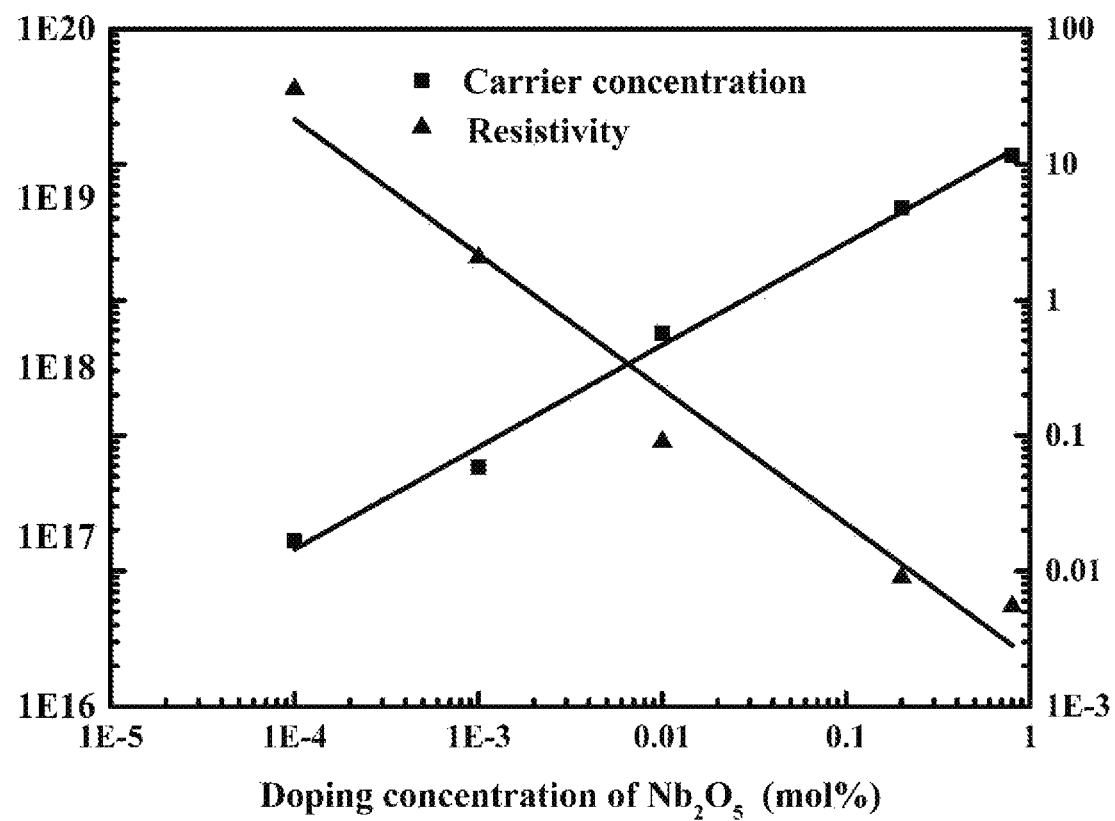
FIG. 3 is a graph showing the relationship between the doping concentration of $Nb_2O_5$ (as shown in the horizontal axis (mol %)) and the carrier concentration (as shown on the vertical axis on the left ($cm^{-3}$)) and resistivity (as shown on the vertical axis on the right ($\Omega\cdot$cm)) of the Nb-doped $\beta$-$Ga_2O_3$ primary crystal of Example 5-9 in the present invention.

Further, in order to study the relationship between different doping concentrations and carrier concentration or resistivity, the $Ta_2O_5$ doping concentration-carrier concentration-resistivity curve of samples without annealing in Examples 1-4 are shown in FIG. 1. Examples 5-9 correspond to the curve of $Nb_2O_5$ doping concentration-carrier concentration-resistivity, as shown in FIG. 3. In addition, in order to study the relationship between the doping concentration of $Ta_2O_5$ and carrier concentration after annealing, the present invention draws the doping concentration-carrier concentration curve of the sample annealed in Examples 1-4 as shown in FIG. 2.

It can be seen from FIGS. 1 and 3 that there is a linear relationship between $M_2O_5$ doping concentration and carrier concentration, and between $M_2O_5$ doping concentration and resistivity. Within the doping concentration range of the present invention, the carrier concentration increases linearly and the resistivity decreases linearly with the increase of $M_2O_5$ doping concentration before annealing. As shown in FIG. 2, the carrier concentration decreases after annealing.

It should be noted that the carrier concentration and resistivity of the above Group VB elements doped $Ga_2O_3$ single crystal are obtained by the specific experiments of the present invention. Due to the influence of the purity of raw materials, preparation technology and test conditions, the measured carrier concentration and resistivity of the doped crystal will be different from the theoretical value, or there is a situation that can not be detected. Therefore, the above examples are merely illustrations. According to the Group VB element doping concentration disclosed by the present invention and the common knowledge in the field, it can be inferred that the carrier concentration of the Group VB element doped $Ga_2O_3$ crystalline material can be controlled in the range of $5 \times 10^{12}$ to $7 \times 10^{20}$/cm³, and the resistivity can be controlled in the range of $2.0 \times 10^{-4}$ to $1 \times 10^4$ Ω·cm. Taking Ta as an example, the specific calculation process is as follows.

According to the experiment of the present invention, the maximum value of Ta-doping concentration in the $Ga_2O_3$ single crystal is 1 at % (i.e. x=0.01). The volume of 1 mol-$Ga_2O_3$ is 184.44/5.94 cm³=31 cm³;

The number of Ta atoms in 1 mol Ta-doped $Ga_2O_3$ is: $1 \times 2 \times 1\% \times 6.023 \times 10^{23} = 1.2 \times 10^{22}$; therefore, the theoretical value of carrier concentration of Ta-doped $Ga_2O_3$ is $2 \times 1.2 \times 10^{22}/31 = 7.7 \times 10^{20}$/cm³.

The Hall effect instrument with low resistance module is used to test the resistivity below the limit value of $10^5$ Ω·cm. The experiment of the present invention shows that the resistivity of 6N pure $Ga_2O_3$ crystal exceeds the test limit after annealing, indicating that the resistivity of 6N pure $Ga_2O_3$ crystal exceeds $10^5$ Ω·cm. Therefore, the resistivity of 6N pure $Ga_2O_3$ doped with Ta can be controlled to $1 \times 10^4$ Ω·cm, which is 1/1266 of Example 1. The carrier concentration in the example is multiplied by 1/1266, $3 \times 10^{12}$/cm³ can be obtained, so it is feasible to achieve $5 \times 10^{12}$/cm³ carrier concentration in Ta-doped—$Ga_2O_3$ crystal material. The doping concentration of Ta corresponding to the doping concentration is $10^{-7}$ at %.

Therefore, the amount of Ta doping in Ta-doped $Ga_2O_3$ crystalline materials can be controlled in the range of x=0.000000001 to 0.01, the resistivity can be controlled in the range of $2.0 \times 10^{-4}$ to $1 \times 10^4$ Ω·cm, and the carrier concentration can be controlled in the range of $5 \times 10^{12}$ to $7 \times 10^{20}$/cm³.

Other doped elements including Nb and V may be calculated by the same method.

The examples of the present invention are described above. However, the examples mentioned are only examples for illustration and are not intended to limit the present invention. Technicians in the field may make a number of changes and modifications without departing from the spirit and scope of the present invention. The scope of protection advocated by the present invention shall prevail as described in the claims.

We claim:

1. A doped gallium oxide crystalline material, wherein the gallium oxide crystalline material is doped with a Group VB element, and the gallium oxide crystalline material has a resistivity in a range of $2.0\times10^{-4}$ to $1\times10^{4}\Omega\cdot cm$, a carrier concentration in the range of $5\times10^{12}$ to $7\times10^{20}/cm^{3}$, or both; and a molecular formula of the doped gallium oxide crystalline material is $Ga_{2(1-x)}M_2O_3$, doped element M is vanadium (V), niobium (Nb), tantalum (Ta), or a combination thereof, and x is defined as $0.000000001 \leq x \leq 0.01$.

2. The doped gallium oxide crystalline material of claim 1, wherein the gallium oxide is a monoclinic crystal with a space group of C2/m.

3. The doped gallium oxide crystalline material of claim 1, wherein x is defined as $0.000001 \leq x \leq 0.01$.

4. The doped gallium oxide crystalline material of claim 1, wherein the doped gallium oxide crystalline material is Ta-doped —$Ga_2O_3$ crystalline material, and the Ta-doped —$Ga_2O_3$ crystalline material has a resistivity in a range of $2.0\times10^{4}$ to $1\times10^{4}\Omega\cdot cm$, a carrier concentration in a range of $5\times10^{12}$ to $7\times10^{20}/cm^{3}$, or both.

5. The doped gallium oxide crystalline material of claim 4, wherein the Ta-doped —$Ga_2O_3$ crystalline material is a Ta-doped $Ga_2O_3$ crystal, and the Ta-doped $Ga_2O_3$ crystal optionally has a resistivity in a range of $2.0\times10^{-3}$ to $3.6\times10^{2}\Omega\cdot cm$, a carrier concentration in a range of $3.7\times10^{15}$ to $6.3\times10^{19}/cm^{3}$, or both.

6. The doped gallium oxide crystalline material of claim 4, wherein the Ta-doped —$Ga_2O_3$ crystalline material is a Ta-doped $Ga_2O_3$ single crystal, and the Ta-doped $Ga_2O_3$ single crystal optionally has a resistivity in a range of $4\times10^{-3}$ to $7.9\Omega\cdot cm$, a carrier concentration in a range of $3.7\times10^{15}$ to $3.0\times10^{19}/cm^{3}$, or both.

7. The doped gallium oxide crystalline material of claim 1, wherein the doped gallium oxide crystalline material is a Nb-doped $Ga_2O_3$ crystalline material having a resistivity in a range of $2.5\times10^{-4}$ to $1\times10^{4}\Omega\cdot cm$, a carrier concentration in a range of $5\times10^{12}$ to $5.6\times10^{20}/cm^{3}$, or both.

8. The doped gallium oxide crystalline material of claim 7, wherein the Nb-doped $Ga_2O_3$ crystalline material is Nb doped $Ga_2O_3$ crystal, and the Nb-doped $Ga_2O_3$ crystal optionally has a resistivity in a range of $2.5\times10^{-3}$ to $3.6\times10^{2}\Omega\cdot cm$, a carrier concentration of $3.7\times10^{15}\sim5\times10^{19}/cm^{3}$, or both.

9. The doped gallium oxide crystalline material of claim 7, wherein the Nb-doped $Ga_2O_3$ crystalline material is Nb-doped $Ga_2O_3$ single crystal, and the Nb-doped $Ga_2O_3$ single crystal optionally has a resistivity in a range of $5.5\times10^{-3}$ to $36 \Omega\cdot cm$, a carrier concentration in a range of $9.55\times10^{16}$ to $1.8\times10^{19}/cm^{3}$, or both.

10. The doped gallium oxide crystalline material according to claim 1, wherein the doped gallium oxide crystalline material is V-doped $Ga_2O_3$ crystalline material having a resistivity in a range of $2.0\times10^{-4}$ to $1\times10^{4}\Omega\cdot cm$, a carrier concentration in a range of $5\times10^{12}$ to $7\times10^{20}/cm^{3}$, or both.

11. The doped gallium oxide crystalline material according to claim 10, wherein the V-doped $Ga_2O_3$ crystalline material is V doped $Ga_2O_3$ crystal, and the V-doped $Ga_2O_3$ crystal optionally has a resistivity in a range of $2.0\times10^{-3}$ to $3.6\times10^{2}\Omega\cdot cm$, a carrier concentration in a range of $3.7\times10^{15}$ to $6.3\times10^{19}/cm^{3}$, or both.

12. The doped gallium oxide crystalline material of claim 10, wherein the V-doped $Ga_2O_3$ crystalline material is V-doped $Ga_2O_3$ single crystal, and the V-doped $Ga_2O_3$ single crystal optionally has a resistivity in a range of $3\times10^{-2}$ to $50 \Omega\cdot cm$, a carrier concentration in a range of $5\times10^{15}$ to $3.69\times10^{18}/cm^{3}$, or both.

13. A method for preparing the M-doped gallium oxide crystalline material as described in claim 1, comprising
mixing $M_2O_5$ and $Ga_2O_3$, both the $M_2O_5$ and $Ga_2O_3$ having a purity of above 4N, in a molar ratio of (0.000000000001-0.01):(0.9999999-0.99) to grow crystals,
obtaining the M-doped gallium oxide crystalline material, and
optionally, annealing the M-doped gallium oxide crystalline material after crystal growth.

14. The method for preparing the M-doped gallium oxide crystalline material of claim 13, wherein the purity of $M_2O_5$ and $Ga_2O_3$ are both over 5N.

15. The method for preparing the M-doped gallium oxide crystalline material of claim 13, wherein the M-doped gallium oxide crystalline material is an M-doped single crystal, the purity of $Ga_2O_3$ is higher than 6N, and the molar ratio of $M_2O_5$ and $Ga_2O_3$ is in a range of (0.000001-0.01):(0.999999-0.99).

16. The method for preparing the M-doped gallium oxide crystalline material of claim 15, wherein the M-doped single crystal is grown by a melt method that is an edge defined film-fed growth (EFG) method, Czochralski method, floating zone method, or Bridgman method.

17. An M-doped gallium oxide crystalline material prepared by the method of claim 13.

18. A method for using the doped gallium oxide crystalline material of claim 1, wherein the doped gallium oxide crystalline material is applied in power electronic devices, optoelectronic devices, photocatalysts, or conductive substrates.

19. The method for using the doped gallium oxide crystalline material of claim 18, wherein the photoelectronic devices comprises transparent electrodes, solar panels, light emitting devices, photodetectors, sensors, and a combination thereof, and the conductive substrate is for GaN-based material, AlN-based material, both GaN-based and AlN-based material, or $Ga_2O_3$.

* * * * *